US009279859B2

(12) United States Patent
Strohmayer et al.

(10) Patent No.: US 9,279,859 B2
(45) Date of Patent: Mar. 8, 2016

(54) CONTROL CIRCUIT FOR DETERMINING A CHARGE CURRENT OF A BATTERY

(71) Applicant: Dialog Semiconductor GmbH, Kirchheim/Teck-Nabem (DE)

(72) Inventors: Klaus Strohmayer, Graz (AT); Stephan Dobretsberger, Puchenau (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 89 days.

(21) Appl. No.: 14/174,973

(22) Filed: Feb. 7, 2014

(65) Prior Publication Data

US 2014/0285207 A1 Sep. 25, 2014

(51) Int. Cl.
*G01N 27/416* (2006.01)
*G01R 31/36* (2006.01)
*H02J 7/00* (2006.01)
*H02J 7/04* (2006.01)

(52) U.S. Cl.
CPC ........... *G01R 31/3606* (2013.01); *H02J 7/0068* (2013.01); *H02J 7/044* (2013.01)

(58) Field of Classification Search
CPC ...... Y02E 60/12; H02J 7/0044; H02J 7/0042; H02J 7/0045; H02J 7/0068; H02J 7/022; H02J 7/0031; H01M 2/1022; H01M 10/44
USPC ........................................................ 324/426
See application file for complete search history.

(56) References Cited

U.S. PATENT DOCUMENTS

| | | | |
|---|---|---|---|
| 5,583,417 A | 12/1996 | Yuen | |
| 6,025,695 A | 2/2000 | Friel et al. | |
| 6,137,264 A | 10/2000 | Downs et al. | |
| 2002/0109486 A1 * | 8/2002 | Tange | H02J 7/0031 320/162 |
| 2003/0126474 A1 | 7/2003 | Sawyers et al. | |
| 2004/0075418 A1 * | 4/2004 | Densham | H02J 7/02 320/111 |
| 2004/0100226 A1 * | 5/2004 | Sakurai | H02J 7/0031 320/136 |
| 2004/0150704 A1 * | 8/2004 | Horigome | B41J 3/36 347/109 |
| 2005/0134227 A1 * | 6/2005 | Wozniak | H01M 10/4207 320/134 |
| 2006/0176021 A1 * | 8/2006 | Krause | H02J 7/0027 320/128 |
| 2006/0197493 A1 * | 9/2006 | Kim | H02J 7/025 320/108 |
| 2007/0216378 A1 | 9/2007 | Ozawa et al. | |
| 2008/0116848 A1 | 5/2008 | Chen | |
| 2010/0117592 A1 * | 5/2010 | Lim | H01M 10/441 320/101 |
| 2012/0139345 A1 | 6/2012 | Ye et al. | |

OTHER PUBLICATIONS

European Search Report 13156099797-1804 mailed: Jul. 26, 2013, Dialog Semiconductor GmbH.

* cited by examiner

*Primary Examiner* — Arun Williams
(74) *Attorney, Agent, or Firm* — Saile Ackerman LLC; Stephen B. Ackerman

(57) ABSTRACT

This application relates a method and a control circuit for determining a charge current of a battery connected to a modulated load, wherein a current limited power source is connected in parallel to the modulated load and the battery for supplying a load dependent current up to a predetermined current limit to the modulated load and the battery. The control circuit comprises means for measuring a current flowing through the battery; means for indicating an overload condition of the current limited power source; and means for determining the charge current of the battery. The means for indicating an overload condition are configured to indicate an overload condition when a sum of a current drawn by the modulated load and a current flowing into the battery exceeds the predetermined current limit of the current limited power source.

25 Claims, 5 Drawing Sheets

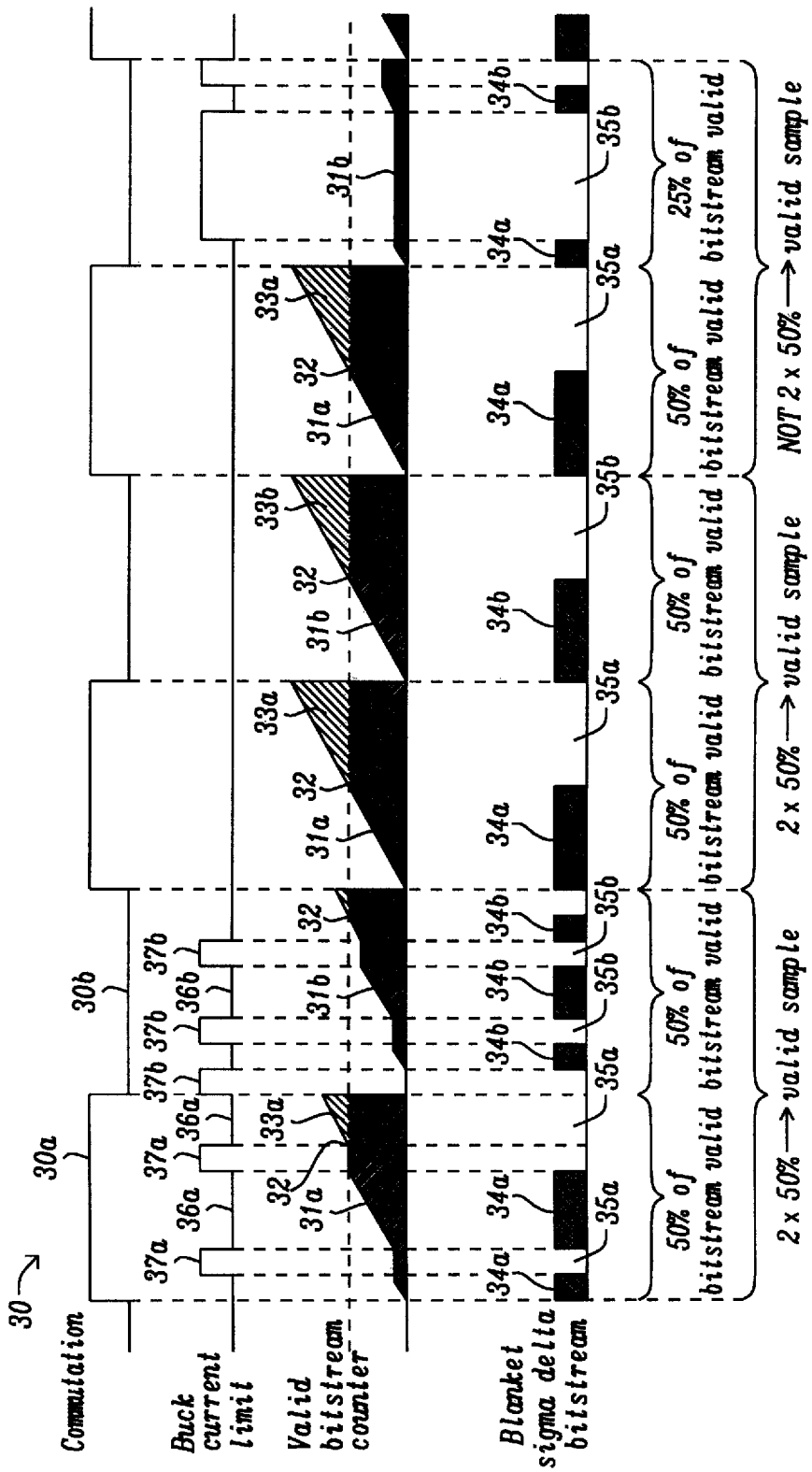

CONTROL CIRCUIT FOR DETERMINING A CHARGE CURRENT OF A BATTERY

TECHNICAL FIELD

This application relates to the area of battery charging. In particular, it relates to a method and a control circuit for determining a charge current of a battery for determining the end of charge condition of a battery charging cycle.

BACKGROUND

This application is located in the area of battery charging. To determine the end of charge condition of a battery charging cycle as well as for fuel gauge algorithms, it is required to measure the charge current of the battery. Measuring the average charge current is often performed by applying a long integration period. The integration period is typically in the range of a second. This method is suitable for fuel gauging but inaccurate for end of charge detection due to the fact that a current may be pulled out of the battery by a load while charging the battery so that the current measurement could be distorted. For end of charge detection, it is desired to accurately determine the maximum charge current which would flow into the battery if the battery charge current was not influenced by the system load and the power supply's current limitation.

Thus, for an accurate end of charge detection, there is a need for a method and device for determining the maximum and undistorted charge current of a battery of a load modulated system.

SUMMARY

In accordance with an aspect, a control circuit for determining a charge current of a battery connected to a modulated load is proposed. A current limited power source is connected in parallel to the modulated load and the battery, for supplying a load dependent current up to a predetermined current limit to the modulated load and the battery. The control circuit comprises means for measuring a current flowing through the battery, means for indicating an overload condition of the current limited power source, and means for determining the charge current of the battery.

Said means for indicating an overload condition are configured to indicate an overload condition when a sum of the current drawn by the modulated load and the charging current of the battery (depending on the battery charging state at this time, e.g. precharge, constant current charging, constant voltage charging, etc.) exceeds the predetermined current limit of the current limited power source. Thus, an overload situation is indicated when the current limited power source is not able to provide enough current to supply the modulated load and to provide all required battery charge current. It is further noted that the system load has priority over the battery charging. Therefore, if the power supply reaches its limit and can't provide more current, the system will start to "steal" charging current. Thus, the "distorted" charging current can still be positive, meaning that current is still flowing into the battery, during an overload condition, when the sum of the load current provided to the modulated load and the required battery charge current exceeds the available supply current.

In accordance with this aspect, said means for determining the charge current of the battery are configured to determine the charge current based on measured current values selected from one or more time intervals during which no overload condition is indicated by the means for indicating the overload condition. Using the indication of an overload condition to determine the correct point in time for a valid charge current measurement allows determining real battery charge current that is not distorted.

In accordance with a further aspect, the means for measuring a current flowing through the battery may comprise an analog-to-digital converter connected to a resistor which is connected in series to the battery. The analog-to-digital converter may be configured to measure a voltage drop over the resistor. Preferably, the analog-to-digital converter may be a sigma delta analog-to-digital converter. The resistor may be a shunt resistor in order not to disrupt the circuit.

In accordance with a further aspect, a compensation of a potential offset error of the means for determining the charge current, e.g. a sigma delta ADC, may be achieved, for example through providing commutation means for switching input signals of the current measuring means. The input signal may be switched so that the input signals are commutated during a first half of a measurement period compared to a second half of the measurement period. The means for determining the charge current of the battery may preferably be configured to use the same number of current measurement values of the first half as of the second half of the measurement period for determining the charge state, thereby cancelling offset errors.

In accordance with a further aspect, the control circuit may comprise counter means configured to count a number of current measurement values during the first half of the measurement period and to count a number of current measurement values during the second half of the measurement period.

The means for determining the charge current may be configured to select measurement values in each half of the measurement period until the counter has reached a predetermined threshold value. This ensures that the same minimum number of current samples is available in two successive half periods for an offset compensation. By way of example, the counter means may be a bit counter configured to count output bits of the analog-to-digital converter. This is particular useful for a sigma delta analog-to-digital converter.

According to an aspect, all measurement values in the measurement period may be discarded if the counter did not reach the predetermined threshold value in the first half or in the second half of the measurement period. This has the advantage that it is ensured that a minimum number of measurement values is available to maintain a level of accuracy for the current measurement.

Increasing the predetermined threshold value would increase the accuracy of the determined charge current but would also increase the likelihood of overload conditions during the measurement periods and that measured samples would have to be discarded if the threshold value was not reached. In accordance with an aspect of the invention, it is therefore beneficial to dynamically adjust the threshold value if it has been set too high. By way of example, the control circuit may be configured to lower the predetermined threshold after it has been determined that the predetermined threshold value of current measurement values has not been reached during a predetermined number of subsequent measurement periods, in one of the two half periods of each measurement period.

In accordance with a further aspect of the invention, the current limited power source may be a power converter such as a buck converter or a linear converter (LDO). Other power sources which have a power limit can be used as well. It is beneficial for a compact design of the control circuit, if the means for indicating the overload condition are integrated into the current limited power source. By way of example, the means for indicating the overload condition may be integrated into the power source (e.g. buck converter). However, it will be appreciated that the information regarding an overload condition may also be generated externally of the current limited voltage source.

In accordance with a further aspect, it is possible to determine the sign of the current flowing through the battery. By way of example, the sign of the current flowing through the battery could be determined using the means for determining the charge current by determining the sign of the voltage drop over the resistor connected in series to the battery.

In accordance with a further aspect of the invention, said means for determining the charge current may be configured to accumulate measured current values for time intervals for which no overload condition is indicated. This facilitates determining the charge state of the battery.

In accordance with a further aspect of the invention, said means for determining the charge state may comprise a gate logic to selectively pass output bits of the analog-to-digital converter for time intervals for which no overload condition is indicated and to block output bits for other time intervals. This facilitates accumulation of current values.

In addition, a load modulated system is proposed, comprising a modulated load, a chargeable battery, a current limited power source, and a control circuit as described above.

In addition, a method for determining a charge current of a chargeable battery connected in parallel to a modulated load and a current limited power source for supplying a load dependent current up to a predetermined current limit is provided. The method comprises the steps: indicating an overload condition when a current drawn by the modulated load and the charge current exceed the predetermined current limit of the current limited power source, measuring a current flowing through the battery and selecting measured current values from one or more time intervals for which no overload condition is indicated. The method further comprises the step of determining the charge current of the battery based on the selected current values.

The method may further comprise switching signals of the measured current so that the signals are commutated during a first half of a measurement period compared to a second half of the measurement period, and using the same number of current measurement values of the first half as of the second half of the measurement period for determining the charge state. This allows eliminating an offset error for the current measurement values. Switching signals may be accomplished by commutating input signals of current measuring means such as an analog-to-digital converter (e.g. a sigma delta analog-to-digital converter) connected to a resistor which is connected in series to the battery.

In embodiments, the method further includes counting a number of current measurement values during the first half of the measurement period and counting a number of current measurement values during the second half of the measurement period. Measurement values in each half of the measurement period are selected until the counter has reached a predetermined threshold value. This ensures that a same number of measurement values are used for both measurement periods. In embodiments, all measurement values in the measurement period are discarded if the number of counted measurement values does not reach the predetermined threshold value in the first half and/or in the second half of the measurement period.

Furthermore, measured current values for time intervals for which no overload condition is indicated may be accumulated to determine the charge state of the battery.

It will be appreciated that the above method may be combined in many ways with corresponding aspects described above having regard to the control circuit to form further embodiments.

BRIEF DESCRIPTION OF THE DRAWINGS

The invention is explained below in an exemplary manner with reference to the accompanying drawings, wherein

FIG. 3 shows a timing chart to illustrate the behavior of a control circuit according to an embodiment with a commutation means and a bit stream counter.

DESCRIPTION

Figure 1:
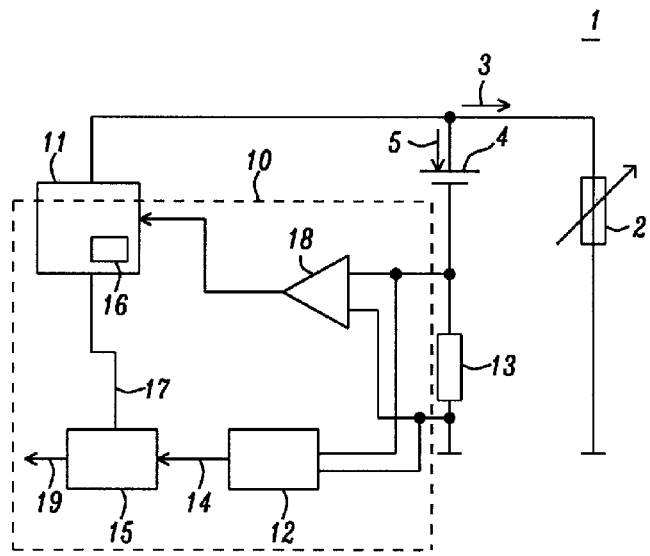
FIG. 1 shows a circuit diagram of an example load modulated system with a control circuit according to an embodiment.

FIG. 1 shows a circuit diagram of an example load modulated system 1 with a control circuit 10 according to an embodiment. The current limited power source 11 in the depicted embodiment is a buck converter that supplies the variable load 2, e.g. a mobile phone, with a variable load current 3. The buck converter also provides charge current 5 for the battery 4. The current provided by the current limited power source 11 is limited. In case that the load current 3 exceeds the buck current limit, the battery 4 provides the missing current for the system. In this case, the current 5 through the battery changes direction. Thus, $I_{ps}=I_{bat}+I_{load}$, wherein $I_{ps}$ corresponds to the current of the current limited power source 11, $I_{bat}$ corresponds to the current 5 of the battery 4 and $I_{load}$ corresponds to the current 3 of the modulated load 2.

The control circuit 10 of this embodiment is shown in FIG. 1 as the area within the dashed line. The control circuit 10 comprises multiple sub-functions such as means for measuring a current flowing through the battery, means for indicating 16 an overload condition of the current limited power source, and means for determining the charge current of the battery.

The means for measuring a current flowing through the battery measures the voltage drop over a shunt resistor 13 connected in series to the battery 4 by a sigma delta analog-to-digital converter 12. The voltage drop across the shunt 13 is proportional to the current flowing through it, and since its resistance is known, the measured voltage across the shunt can be scaled to determine the battery current. The measured value of the sigma delta analog-to-digital converter 12 is outputted as a bit stream 14 to a logic gate 15 that is configured to determine the charge current of the battery 4 based on the bit stream 14. The valid bits of the bitstream are summed for each commutation period until the predefined number of samples is reached which is the same as averaging and scaling afterwards.

The control circuit further comprises a differential amplifier 18 with the voltage drop of the shunt resistor 13 as input values. The output of the differential amplifier 18 is fed back to the buck converter 11 as a feedback loop to control the current provided by the buck converter 11 up to the predetermined limit value of the buck converter.

For detecting the charging state of the battery 4, especially for determining the end of charge condition for battery loading, it is required to determine the real battery charge current. For conducting a reliable battery charge current measurement, the means for indicating 16 an overload condition of the buck converter is configured to determine that the buck converter 11 is able to provide enough current to charge the battery 4. This means that the sum of load current 3 and battery charge current 5 does not exceed the available supply current of the current limited voltage source 11. The means 16 for indicating an overload condition of the buck converter may be integrated in the buck converter. This is illustrated by the dashed line cutting through the buck converter and encompassing the overload condition indicating means 16.

A determined overload condition is indicated by the overload condition signal 17 which is generated inside the buck converter 11 or other power converter such as a linear converter. In other words, the generated overload condition signal 17 enables to determine the correct point in time for a valid charge current measurement. In embodiments, the overload condition is generated by the following events: the coil current of the buck converter reaches its safety limit, or the average input current to the power converter reaches a limit.

For example, the average input current is measured at the power converter input and this information is feed into the control loop to reduce the duty cycle of the power converter and so limit the input current. For safety reasons, also the power converter output current can be limited. Otherwise, the power converter or external components such as the external coil could be damaged. For example, the peak output current is measured in the high side switch of the buck converter and is feed back to the control loop to reduce the duty cycle of the buck converter and so limit the output current. This principle is not limited to buck converts. Instead of the buck converter, a linear regulator (e.g. an LDO) could be used. The requirements for current limitation are the same.

The output signal 17 of the means 16 for indicating an overload condition is used by the logic gate 15 to selectively pass output bits of the analog-to-digital converter 12 only for time intervals for which no overload condition is indicated and to block output bits for other time intervals. This facilitates accumulation of current values. A sigma delta A/D converter has (in most cases) a 1 bit output only so that the measurement value is either −1 ("max current out of battery") or +1 ("max current into battery"). For a more accurate measurement, it is preferable to make an average of several measurements. By way of example, if no current is flowing into or out of the battery, then the number of −1 and +1 measurements will be equal, giving an average of 0. If a small current is flowing into the battery, then the number of '+1' measurements will be slightly higher than the '−1' measurements, resulting in a slightly positive value. The accuracy of the calculated average value increases with the number of measurement values. It is noted that counting is equivalent to averaging and at the same time scaling the result by the number of samples.

It is noted that using appropriate filters instead of averaging could result in even better accuracy with the same number of samples. It is also possible to use higher order sigma delta modulators, which would have a multi bit output.

The voltage drop over the shunt resistor 13 is proportional to the current flowing into the battery or flowing out of the battery. Therefore, a continuous shunt voltage measurement is proportional to the average battery current. However, using the generated overload condition signal to selectively use output bits during intervals with no overload condition, it is ensured that only the current flowing into the battery (i.e., battery charge current) is measured that is not distorted.

It is noted that the change of the battery charge state varies slowly. The time constant for this change is in the range of seconds or minutes. For this reason, the charge current measurement can be done with a slow frequency, e.g. one second. On the other hand, the load modulation is characterized usually by a much higher frequency, e.g. GSM pulses with a frequency of 216 Hz. Measurement samples that represent current flowing out of the battery or already a reduced charging current would therefore distort the charge current measurement. The proposed overload condition indication means 16 in combination with the gate logic 15 therefore ensures that the charge current of the battery 4 is determined only based on measurement current value selected from time intervals during which the battery charging current is not distorted, i.e., no current is flowing out of the battery or charging current flowing into the battery is not reduced, since no overload condition exists.

Figure 2A:
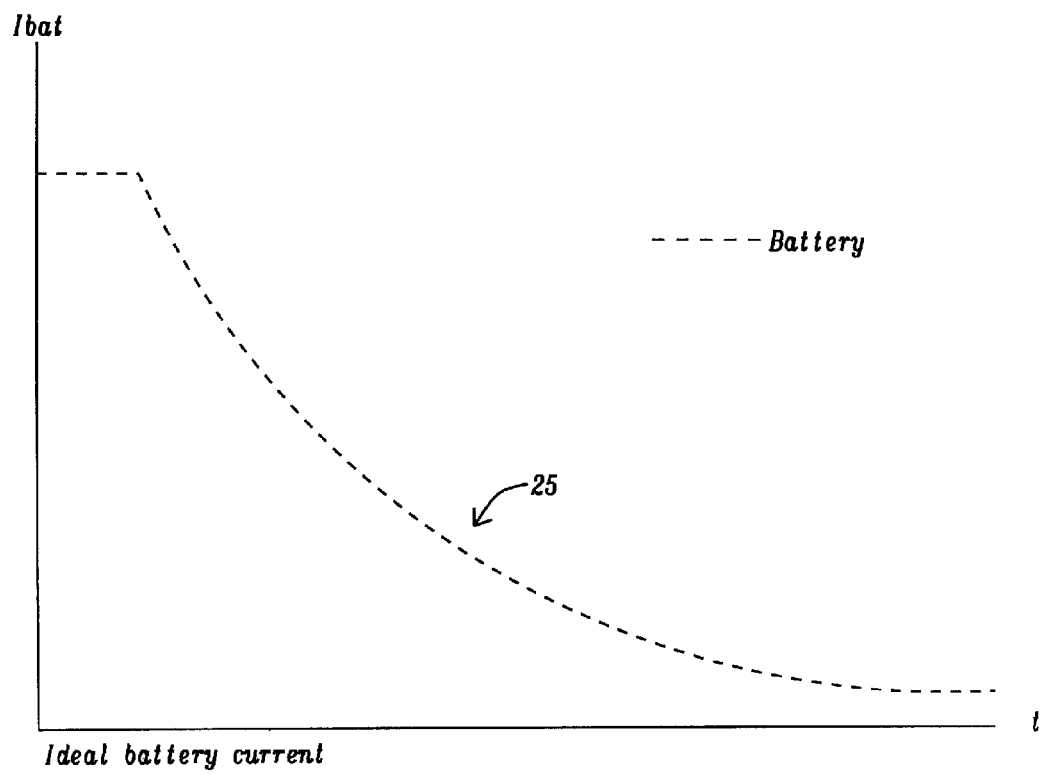
FIG. 2A to FIG. 2E show the variation in time of the battery charge current and the load current of a load modulated system to illustrate the proposed measurement method and control circuit.
Figure 2B:
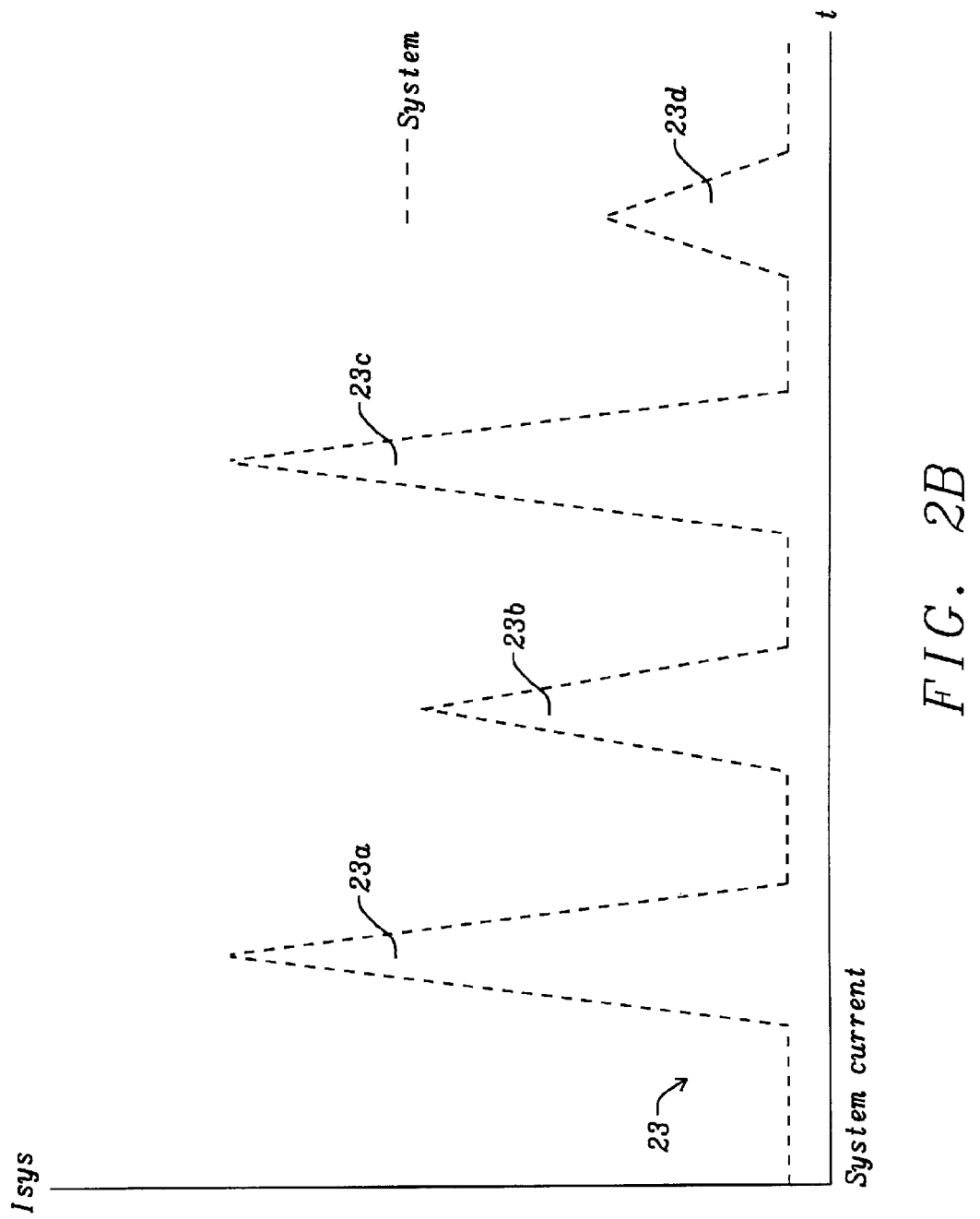

This is further illustrated in FIG. 2A to FIG. 2E. FIG. 2A shows a typical curve of an ideal battery charge current 25. The battery current $I_{bat}$ is typically a constant over a certain time interval after which it decreases rather sharply towards zero. FIG. 2B illustrates a system current $I_{sys}$ (current of the modulated load) that is characterized by short and sharp peaks in time during which the system current sharply increases from a non-zero base load to a peak value and quickly drops back to the base load. According to another embodiment (not shown), the system could consume a large amount of current for a longer period of time so that the system current $I_{sys}$ would not be characterized by short and sharp peaks as depicted in FIG. 2B, but rather by an extended period of an increased current level (e.g. when the user is watching a video or playing a game). According to this embodiment, the current source can't provide the required amount current for charging.

It is noted that the time scales shown in FIG. 2A and 2B do not match and are only for illustration purposes. The time scale in FIG. 2A is in the range of minutes or hours reflecting normal battery charging, whereas the time scale of the sharp peaks 23a, 23b, 23c, and 23d of the system current is in the range of milliseconds.

Figure 2C:
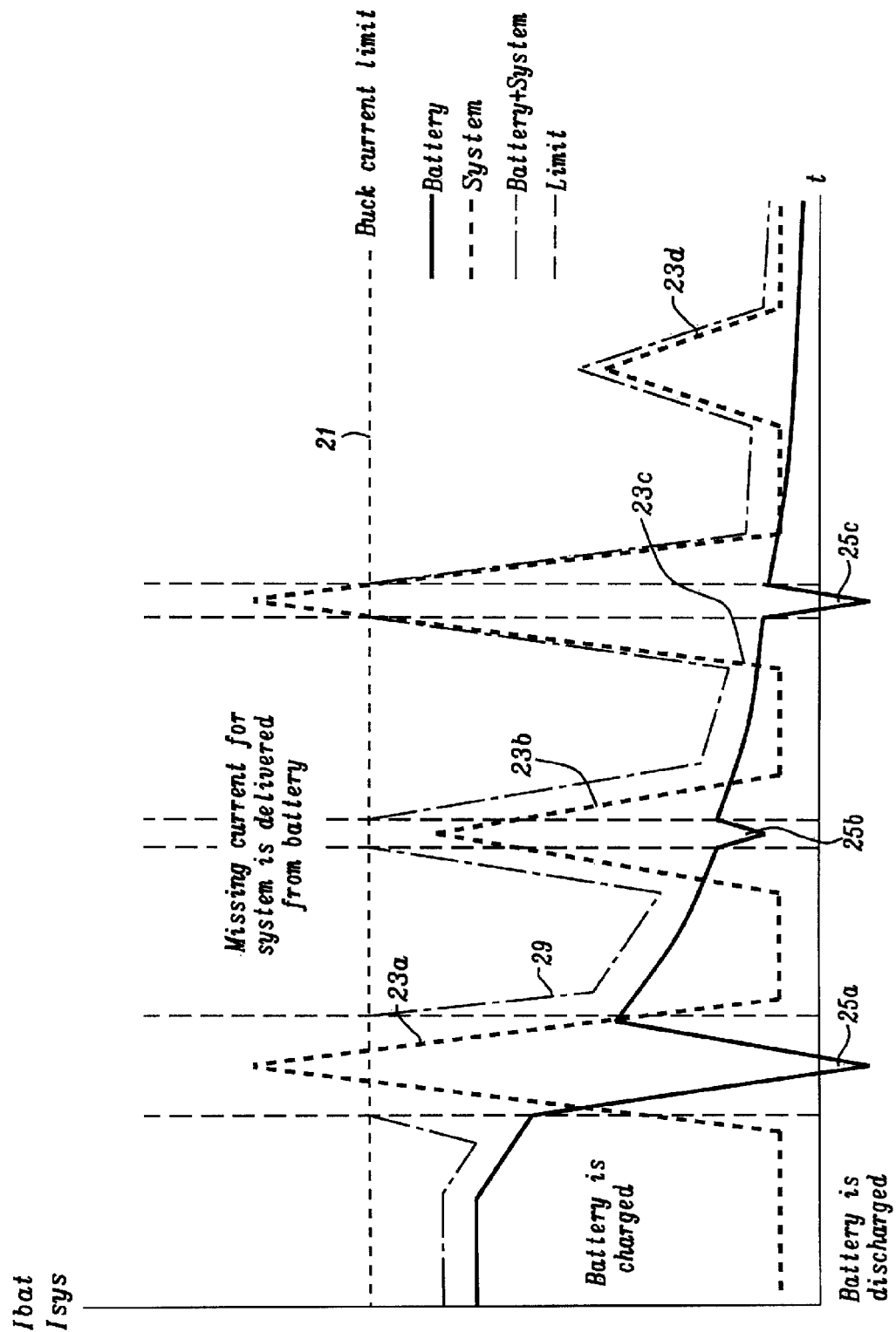

The effect of the system current peaks shown in FIG. 2B on the battery charge current and battery charge state is illustrated in FIG. 2C. The straight line 21 illustrates the current limit of the buck converter 11. As explained above, if the system current exceeds the current limit 21 of the buck converter, the battery 4 provides for the missing current.

This is the case for the peaks 23a, 23b, and 23c shown in FIG. 2B and 2C since the peaks exceed the buck current limit 21 so that the charge state of the battery is temporarily reduced as shown by the downward peaks 25a, 25b, and 25c. As noted above, the peaks 25a to 25c and 23a to 23d are not drawn to scale for illustration purposes, as the width of the peaks is in the range of milliseconds and are thus in reality much smaller than depicted in the figures. By way of example, the battery charging current 25b that provides for the missing current to compensate for the peak 25b is still positive so that the battery is still charged, but with less current. The same applies for the peaks 23a and 23c and the corresponding battery currents 25a and 25c within the first and last third of the overload condition, where the battery current is still above zero.

Figure 2D:
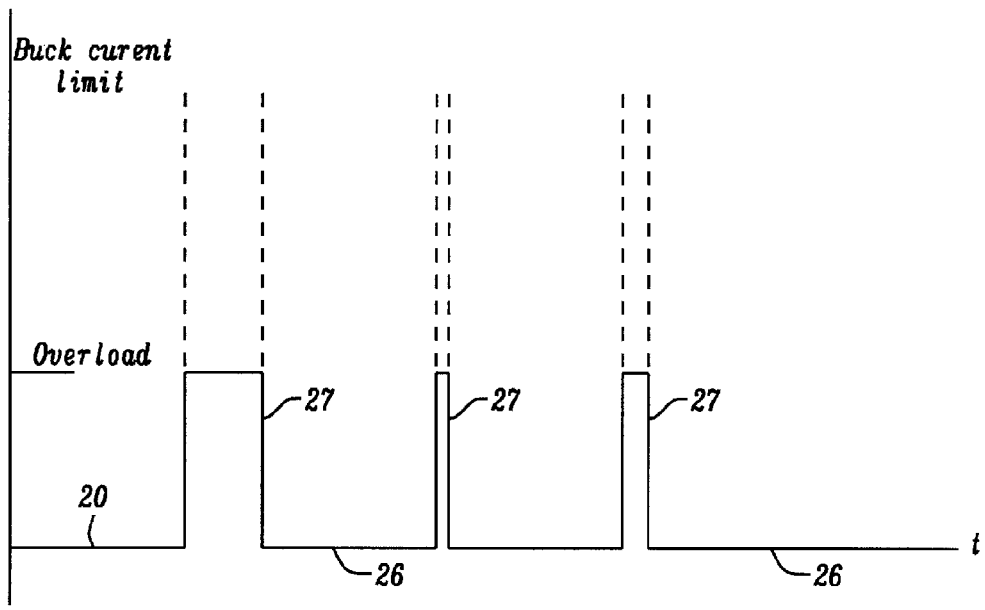
Figure 2E:
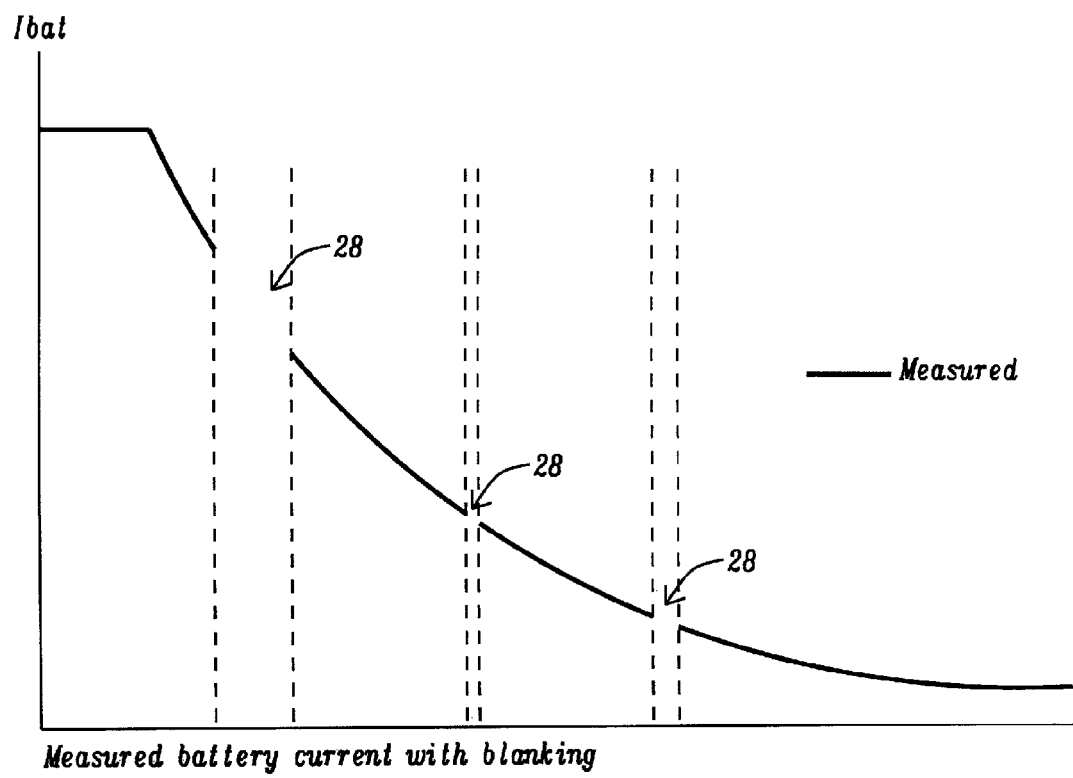

FIG. 2D shows the output of the means 16 for indicating an overload condition. As soon as the sum of the battery current and the system current, indicated by the curve 29, exceeds the buck current limit 21, an overload condition signal switches from low 26 to high 27 to indicate an overload condition. During the time intervals during which the overload condition signal is set to high 27, the measured values used for measuring the battery current based on the shunt resistor are discarded, since they are distorted by the peaks 25a, 25b and 25c of currents flowing out of the battery. These measurement periods that are not used for measuring the charge current are illustrated in FIG. 2E with the reference number 28.

A further embodiment of operation of a control circuit is illustrated with the timing chart of FIG. 3. In the present embodiment, offset compensation is achieved with an additional commutation means that switches the input signals of the sigma delta analog-to-digital converter 12 so that the input signals into the sigma delta analog-to-digital converter 12 are commutated during a first half of a measurement period versus a second half of a measurement period. The commutation signal is illustrated by the upper line 30 in FIG. 3, wherein the input signals to the sigma delta analog-to-digital converter are switched during a first half period 30a versus a second half period 30b.

The second signal line illustrates the output of the means 16 for indicating an overload condition, wherein the low state 36a indicates that no overload condition exists during a first half period, whereas the high state 37a indicates an overload condition during the first half period. Likewise, the low state 36b indicates that no overload condition exists during a second half period, whereas the high state 37b indicates an overload condition during the second half period.

For systems that use an offset compensation via commutation of input signals, it is preferable if the number of samples taken in the first commutation period 30a is the same as the number of samples in the second commutation period 30b.

Therefore, a bit stream counter is provided that is configured to count the number of current measurement values during the first half 30a of the measurement period and to count the number of current measurement values during the second half 30b of the measurement period, wherein only measurement values are counted when the overload condition signal is set to a low state 36a (no overload condition).

This is illustrated in the third timing chart of FIG. 3 by the horizontal line of the bit steam counters, i.e. no bits are counted during the periods 37a and 37b that indicate an overload condition.

The bit stream counter is further configured to selectively pass the measured bit stream values in each half of the measurement periods until the counter has reached a predetermined threshold value 32 that is set in the current example to 50% of the possible bit stream values. The bit stream labeled with reference numbers 31a, 31b is the bit stream from the counter before it reaches the threshold value 32 and the bit stream labeled with reference numbers 33a, 33b is the bit stream from the counter after it reached the threshold value 32.

Thus, the area of the bit stream labeled with the reference number 33a in the first half of the measurement period and the area labeled with the reference number 33b in the second half of the measurement period are discarded, since the number of valid bits (measurements) has already reached the predetermined threshold of 50%.

The result of the bit stream counter that uses the predetermined threshold value is shown in the lower timing chart of FIG. 3 that shows the blanked sigma delta bit stream, wherein the area labeled with the reference number 34a shows measured portions of the bit stream outputted by the sigma delta analog-to-digital converter that is used for the current measurement. Areas labeled with the reference number 35a denote areas that are not used for the current measurement, since either an overload condition was indicated by the overload condition indication means or the bit stream counter has already reached the predetermined threshold value.

Likewise, for the second half of the measurement period, the reference number 34b indicates valid bit stream values that are used for the current measurement, whereas areas labeled with 35b illustrate blanked areas of the bit stream where no bit stream values are selected for the current measurement.

In each half of the measurement period, the predetermined threshold value of the bit stream must be reached in order to have the same number of bit stream values for effecting offset compensation. If in at least one half of one of the two measurement periods, this predetermined threshold value (50% in the present example, although it must be noted that this threshold value is only an example and other values may be applied as well) is not reached, then both bit streams in each of the two half's of the measurement period have to be discarded. This is illustrated in FIG. 3, wherein in the second half of the third measurement period, only 25% of the bit stream was judged valid so that the entire measurement sample of both the first half and the second half of the third measurement period have to be discarded.

The control circuit is further configured to dynamically adjust the threshold value in case it determines that the threshold was set too high or too low. For instance, the control circuit is configured to lower the predetermined threshold 32 after it has been determined that the predetermined threshold value 32 of current measurement values has not been reached during two or another predetermined number of subsequent measurement periods, in one of the two half periods of each measurement period. In this particular example, if during another fourth measurement period (not shown in FIG. 3) the threshold of 50% would not be reached in either the first or the second half period of the fourth measurement period, the threshold of 50% may be lowered to another threshold value.

Although the techniques described herein have been illustrated with specific examples, in which the battery charge current measurements are performed based on voltages, these techniques should not be limited to these examples or embodiments as the techniques can be equally applied to a situation where the comparisons are based on currents or charges.

It should be noted that the description and drawings merely illustrate the principles of the proposed devices and methods. It will thus be appreciated that those skilled in the art will be able to devise various arrangements that, although not explicitly described or shown herein, embody the principles of the proposed devices and methods and are considered to be part of the disclosure of this document. Furthermore, all statements herein reciting principles, aspects, and embodiments of the proposed methods and devices, as well as specific examples thereof, are intended to encompass equivalents thereof.

Furthermore, it should be noted that any circuit diagrams or block diagrams herein represent conceptual views of illustrative devices embodying the principles of the invention. Similarly, it will be appreciated that any control logic, state machines, state transition diagrams, and the like represent various processes which may be substantially represented in computer readable medium and so executed by a computer or processor, whether or not such computer or processor is explicitly shown.

Finally, all examples recited herein are principally intended expressly to be only for pedagogical purposes to aid the reader in understanding the principles of the proposed methods and devices and the concepts contributed by the inventors to furthering the art, and are to be construed as being without limitation to such specifically recited examples and conditions.

What is claimed is:

1. A control circuit for determining a charge current of a battery connected to a modulated load, wherein a current limited power source is connected in parallel to the modulated load and the battery for supplying a load dependent current up to a predetermined current limit to the modulated load and the battery, the control circuit comprising:
   means for measuring a current flowing through the battery;
   means for indicating an overload condition of the current limited power source;
   means for determining the charge current of the battery; and
   means for determining the charge state of the battery;
   wherein said means for indicating an overload condition are configured to indicate an overload condition when a sum of a current drawn by the modulated load and a current flowing into the battery exceeds the predetermined current limit of the current limited power source, and wherein said means for determining the charge current of the battery are configured to determine the charge current based on measured current values selected from one or more time intervals during which no overload condition is indicated by said means for indicating the overload condition.

2. The control circuit according to claim 1, wherein said means for measuring a current flowing through the battery comprise an analog-to-digital converter connected to a resistor which is connected in series to the battery, wherein said analog-to-digital converter is configured to measure a voltage drop over said resistor.

3. The control circuit according to claim 2, wherein said analog-to-digital converter is a sigma delta analog-to-digital converter and said resistor is a shunt resistor.

4. The control circuit according to claim 1, further comprising commutation means for switching input signals of said current measuring means so that the input signals are commutated during a first half of a measurement period compared to a second half of the measurement period, wherein said means for determining the charge current of the battery are configured to use the same number of current measurement values of the first half as of the second half of the measurement period for determining said charge state of the battery.

5. The control circuit according to claim 4, further comprising counter means configured to count a number of current measurement values during the first half of the measurement period and to count a number of current measurement values during the second half of the measurement period, and wherein said means for determining the charge current are configured to select measurement values in each half of the measurement period until the counter has reached a predetermined threshold value.

6. The control circuit according to claim 5, wherein all measurement values in the measurement period are discarded if the counter did not reach the predetermined threshold value in the first half or in the second half of the measurement period.

7. The control circuit according to claim 5, wherein said counter means is a bit counter configured to count output bits of said analog-to-digital converter.

8. The control circuit according to claim 5, wherein said control circuit is configured to lower the predetermined threshold after it has been determined that the predetermined threshold value of current measurement values has not been reached during two or more subsequent measurement periods, in at least one of the two half periods of each measurement period.

9. The control circuit according to claim 1, wherein said means for indicating the overload condition are integrated into the current limited power source.

10. The control circuit according to claim 1, wherein said current limited power source is a buck converter.

11. The control circuit according to claim 1, wherein said means for determining the charge state comprise a gate logic to selectively pass output bits of said analog-to-digital converter for time intervals for which no overload condition is indicated and to block output bits for other time intervals.

12. The control circuit according to claim 1, wherein said means for determining said charge current are configured to accumulate measured current values for time intervals for which no overload condition is indicated to determine said charge state of the battery.

13. A load modulated system, comprising a modulated load; a chargeable battery; a current limited power source; and a control circuit according to claim 1.

14. A method for determining a charge current of a chargeable battery connected in parallel to a modulated load and a current limited power source for supplying a load dependent current up to a predetermined current limit, comprising the steps of:
   indicating an overload condition when a sum of a current drawn by the modulated load and a current flowing into the battery exceeds the predetermined current limit of the current limited power source;
   measuring a current flowing through the battery;
   selecting measured current values from one or more time intervals for which no overload condition is indicated;
   determining the charge current of the battery based on the selected current values; and
   Determining the charge state of the battery.

15. The method according to claim 14, further comprising the steps of:
   switching signals of the measured current so that said signals are commutated during a first half of a measurement period compared to a second half of the measurement period, and
   using the same number of current measurement values of the first half as of the second half of the measurement period for determining said charge state of the battery.

16. The method according to claim 14, wherein said measuring a current flowing through the battery comprises use of an analog-to-digital converter connected to a resistor which is connected in series to the battery, wherein said analog-to-digital converter is configured to measure a voltage drop over said resistor.

17. The method according to claim 16, wherein said analog-to-digital converter is a sigma delta analog-to-digital converter and said resistor is a shunt resistor.

18. The method according to claim 15, further comprising the step of counting a number of current measurement values during the first half of the measurement period and counting a number of current measurement values during the second half of the measurement period, and wherein said determining the charge current comprises selecting measurement values in each half of the measurement period until the counter has reached a predetermined threshold value.

19. The method according to claim 18, wherein all measurement values in the measurement period are discarded if the counter did not reach the predetermined threshold value in the first half or in the second half of the measurement period.

20. The method according to claim 18, wherein said counting of a number of current measurement values comprises use of a bit counter configured to count output bits of said analog-to-digital converter.

21. The method according to claim 18, further comprising lowering the predetermined threshold after it has been determined that the predetermined threshold value of current measurement values has not been reached during two or more subsequent measurement periods, in at least one of the two half periods of each measurement period.

22. The method according to claim 14, wherein said indicating the overload condition is integrated into said current limited power source.

23. The method according to claim 14, wherein said current limited power source is a buck converter.

24. The method according to claim 16, wherein said determining the charge state comprises use of a gate logic to selectively pass output bits of said analog-to-digital converter for time intervals for which no overload condition is indicated and to block output bits for other time intervals.

25. The method according to claim 14, wherein said determining said charge current comprises accumulating measured current values for time intervals for which no overload condition is indicated to determine said charge state of the battery.

* * * * *